United States Patent [19]
Ichikawa et al.

[11] Patent Number: 5,849,163
[45] Date of Patent: Dec. 15, 1998

[54] PROCESS FOR FORMATION OF EPITAXIAL FILM

[75] Inventors: Takeshi Ichikawa, Atsugi; Hidemasa Mizutani, Sagamihara, both of Japan

[73] Assignee: Canon Kabushiki Kaisha, Tokyo, Japan

[21] Appl. No.: 468,233

[22] Filed: Jun. 6, 1995

Related U.S. Application Data

[63] Continuation of Ser. No. 299,803, Sep. 1, 1994, abandoned, which is a continuation of Ser. No. 143,998, Oct. 27, 1993, abandoned, which is a continuation of Ser. No. 752,608, which is a continuation of PCT/JP90/01633, Dec. 14, 1990, abandoned.

[30] Foreign Application Priority Data

Dec. 15, 1989 [JP] Japan ................................ 1-325442

[51] Int. Cl.$^6$ ................................................. C23K 14/34
[52] U.S. Cl. ............................... 204/192.23; 204/192.15; 204/192.3
[58] Field of Search .......................... 204/192.12, 192.23, 204/192.3, 192.15, 298.06, 298.08

[56] References Cited

U.S. PATENT DOCUMENTS

| | | | |
|---|---|---|---|
| 4,756,810 | 7/1988 | Lamont, Jr. et al. | 204/298.06 X |
| 4,800,173 | 1/1989 | Kanai et al. | 37/81 |
| 4,816,126 | 3/1989 | Kamoshida et al. | 204/192.3 |
| 4,824,546 | 4/1989 | Ohmi | 204/192.3 X |
| 4,835,005 | 5/1989 | Hirooka et al. | 427/38 |
| 4,999,096 | 3/1991 | Nehei et al. | 204/298.06 X |
| 5,500,102 | 3/1996 | Ichikawa et al. | 204/192.25 |

OTHER PUBLICATIONS

Japanese Journal of Applied Physics, vol. 19, No. 4, Apr. 1980, pp. L181–L184, Isao Yamada et al., "Crystalline and Electrical Characteristics of Silicon Films Deposited by Ionized–Cluster–Beams".

Akitoshi Ishizaka et al., "Low Temperature Surface Cleaning of Silicon and Its Application to Silicon MBE", Electrochemical Science and Technology, Apr. 1986, pp. 666–671.

P.C. Zalm et al., "Ion beam epitazy of silicon on Ge and Si at temperatures of 400K", Applied Physics Letters., vol. 41 No. 2, Jul. 15, 1982, pp. 167–169.

Tadatsugu Itoh et al., "Low Temperature Silicon Epitaxy by Partialy Ionized Vapor Deposition", Japanese Journal of Applied Physics, pp. 553–557 (1977.

Ohmi et al., "Formation . . . Sputtering", J. Appl. Phys. 66(10), 15 Nov. 1989, pp. 4756–4766.

Vossen et al., "Thin Film Process", Academic Press, 1978, pp. 46–48.

Maissel et al. "Handbook of Thin Film Technology", McGraw Hill Book Co., 1975, pp. 4–10 to 4–22.

*Primary Examiner*—Nam Nguyen
*Attorney, Agent, or Firm*—Fitzpatrick, Cella, Harper & Scinto

[57] ABSTRACT

A process for forming an epitaxial film on a biased substrate by sputtering a target to which a bias voltage and a plasma-generating high-frequency power are applied, wherein the film formation is carried out in an atmosphere having $H_2O$, CO and $CO_2$ partial pressures controlled at $1.0 \times 10^{-8}$ Torr, with the substrate temperature maintained in the range of from 400° to 700° C. The epitaxial film obtained by the process has excellent interface characteristics, very low impurity contents, good crystallinity and excellent step coverage, and is suitable for application to semiconductor devices.

7 Claims, 8 Drawing Sheets

PROCESS FOR FORMATION OF EPITAXIAL FILM

This application is a continuation-in-part of application Ser. No. 08/299,803 filed Sep. 1, 1994, now abandoned, which is a continuation of application Ser. No. 08/143,998 filed Oct. 27, 1993, now abandoned, which is a continuation of application Ser. No. 07/752,608 which is a continuation of PCT/JP90/01633, Dec. 14, 1990, now abandoned.

THE FIELD TO WHICH THE INVENTION PERTAINS

This invention relates to a process for forming an epitaxial film, which is useful for semiconductor devices or the like, by a sputtering technique.

BACKGROUND OF THE INVENTION

Semiconductor devices, or so-called integrated circuits, have a multilayered structure comprising a number of thin films being stacked. The performance of the devices is therefore greatly influenced by the quality of the thin films themselves and the interface conditions of the stacked films. For this reason, the formation of high-quality thin films is one of the most important technologies in providing high-performance semiconductor devices. In particular, the so-called epitaxial growth techniques for newly depositing a high-quality crystal on an existing crystal is indispensable to the present-day semiconductor technology, and much research and development is being carried out on both homo- and hetero-epitaxial growth processes in view of their strong influences on device characteristics.

Central to conventional epitaxial growth processes are chemical vapor deposition (CVD) techniques. The CVD processes, however, are generally carried out at high temperatures (for instance, 1000° C. or above for silicon deposition) and have drawbacks with respect to process limitations and higher cost due to the high process temperatures. With the CVD techniques, in addition, it has become difficult to meet the request for shallow or sharp dopant profiles, which are necessary for devices with high integration and performance sought in recent years. As a candidate for means of meeting these requirements, there have been recently reported low-temperature epitaxial growth processes including molecular beam epitaxy (MBE) (A. Ishizaki, and Y. Shiraki, J. Electrochem. Soc. 133, 666 (1986)); the FOCVD process in which a gaseous starting material and a halogen oxidant are mixed and reacted with each other to form a precursor as a source of film-forming substance (U.S. Pat. No. 4,800,173); the HRCVD process in which gaseous starting materials activated in different activation spaces are separately introduced into a deposition space to form a film (U.S. Pat. No. 4,835,005); and techniques in which an ion beam process is utilized, such as the partially ionized vapor deposition (PIVD) technique (T. Itoh, T. Nakamura, M. Muromachi, and Y. Sugiyama, Jpn. J. Appl. Phys. 16553 (1977)); the ion beam epitaxy (IBE) technique (P. C. Zalm and J. Beckers, Appl. Phys. Lett. 41, 167 (1982)); and the ion cluster beam deposition (ICBD) technique (I. Yamada, F. W. Saris, T. Takagi, K. Matsubara, H. Takaoka, and S. Ishiyama, Jpn. J. Appl. Phys. 19, L181 (1980)).

According to the MBE technique, however, a high-temperature process, at 800° C. or above, is necessary for obtaining high-quality Si epitaxial thin films and it is difficult to achieve high-concentration doping. According to the FOCVD and HRCVD techniques, on the other hand, the use of a chemical reaction involves formation of by-products, which may lead to incorporation of impurities into the growing film. Furthermore, in the so-called ion beam techniques such as IBE and ICBD, the use of an excessively high ion energy causes damages to the substrate, which is the reason why these techniques have not yet succeeded in yielding a high-quality thin film suitable for semiconductor devices.

SUMMARY OF THE INVENTION

This invention h as been accomplished based on the findings obtained as a result of the following experiments, which were carried out by the present inventors in view of the prior art as described above.

It is accordingly an object of this invention to provide a process for forming a high-quality crystalline thin film which, whether homoepitaxially grown or heteroepitaxially grown, has good step coverage, has few imperfections such as point defects, stacking faults, dislocations, etc., has good interface conditions, and in which the amounts of impurity atoms (namely, atoms other than the film constituent atoms) incorporated therein from the film growth atmosphere are small.

The process for forming an epitaxial film according to this invention is a process for forming an epitaxial film on a substrate by a sputtering method wherein a DC voltage and a plasma-generating high-frequency power are applied to a target and said epitaxial film is formed on said substrate applied with a DC voltage, characterized in that film formation is carried out while controlling each of the partial pressures of $H_2O$, CO and $CO_2$ in an atmosphere of a film-forming space at or below $1.0 \times 10^{-8}$ Torr and maintaining the substrate at a temperature in the range of from 400° to 700° C., during the formation of the epitaxial film.

In a preferred embodiment, the process of this invention further comprises applying a high-frequency voltage to the substrate.

According to this invention, the partial pressures of $H_2O$, CO and $CO_2$ upon evacuation of a vacuum chamber of a bias sputtering apparatus and upon film formation are each controlled at or below $1.0 \times 10^{-8}$ Torr, and the substrate during the epitaxial growth of the film is maintained at a temperature in the range of from 400° to 700° C. Because of this, there are provided the following typical advantages : (a) the coefficients of adhesion of atoms which constitute the plasma but are not for constituting the deposited film, such as Ar and He, to the substrate surface are markedly lowered; (b) as a result of the above (a), the chance for the non-film-constituent atoms (Ar, He, etc.) in the plasma to be incorporated into the deposited film is greatly reduced; (c) migration of the film constituent atoms at the surface of the substrate or of the growing film is increased; and (d) as a result of the above (c), crystal growth is efficiently performed with good step coverage to deposit a high quality crystalline film with good step coverage. According to this invention, therefore, it is possible to obtain high-quality epitaxial films efficiently and stably.

One of the two inventors of this invention, Takeshi Ichikawa, together with his co-workers has previously researched silicon epitaxial growth, as summarized below (T. Ohmi, T. Ichikawa, et al., J. Appl. Phys. vol. 66 pp 4756 (1989)).

Conventionally, sputtering techniques have been deemed almost unapplicable to epitaxial growth, because of difficulty in controlling the damage caused by the energy of ions. Film growth by sputtering, however, has many advantageous features, such as easy increases in area, relatively simple construction of equipment, good matching to conventional semiconductor processes, easy control of reaction system, etc. Paying attention to these advantages of the film growth by sputtering, T. Ichikawa and his coworkers made studies on the silicon epitaxial growth by an RF-DC coupled mode bias sputtering system in which a surface layer is activated while suppressing the damage to the substrate, by precise control of the ion energy. In the report on their work, they pointed out that it is possible, by the RF-DC coupled mode bias sputtering system, to achieve formation of silicon thin films with some good quality and a clean interface by surface cleaning, and to achieve a sharp dopant profile and in situ activation of dopant impurities.

The construction of an apparatus suitable for carrying out the RF-DC coupled mode bias sputtering system is shown in FIG. 11. The apparatus is basically a magnetron-RF-DC coupled mode bias sputtering system. In FIG. 11, there are shown a vacuum chamber 91, a target 92, a parmanent magnet 93, a silicon substrate 94, a substrate holder 95, a 100 MHz RF power supply 96, a matching circuit 97, a DC power supply 98 for determining the potential of the target, a DC power supply 99 for determining the potential of the substrate, and low-pass filters 100 and 101 for the target and the substrate, respectively. In this apparatus, an ultraclean gas supply system is used. An oil-free ultrahigh vacuum exhaust system and a TiN coating having good outgassing characteristics in an Al vacuum chamber are adopted, whereby the impurity contents of Ar gas introduced into the chamber can be reduced to a few ppb or below, even for moisture (which is the major impurity. A background vacuum degree before raising the substrate temperature to 300° C of about $2 \times 10^{-10}$ Torr can be achieved. Because the 100 MHz RF power supply is provided for the target, it is possible to generate a high-density plasma. Besides, because the DC power supplies for biasing are connected to the target and substrate through a low-pass filter to enable control of the target and substrate potentials, it is possible to perform independent precise control of the film growth conditions, such as (a) film growth rate, (b) energy of Ar ions bombarding the substrate, and (c) plasma density.

The present inventors made experimental studies on the above RF-DC coupled mode bias sputtering system. As a result, it was found that the RF-DC coupled mode bias sputtering system has the following problems (1) to (3): (1) The Ar gas used in the process is taken into the epitaxial film in an amount of $8 \times 10^{18}$ cm$^3$ or above, resulting in poor film quality. The deterioration of film quality is especially noticeable in device fabrication processes carried out above the film growth temperature. (2) Upon deposition of film on a step portion, a discontinuity is generated in the deposited film (namely, step coverage is poor). (3) Many imperfections, primarily stacking faults, are produced in epitaxial films deposited on a different-conditioned substrate, such as a Si (111) substrate, and in heteroepitaxial films deposited on SiC film or the like, are also accompanied by unsatisfactory interface conditions.

The present inventors made extensive investigations of the causes of these problems, to find out that the principal causes are (i) the high coefficients of adhesion of Ar to the substrate at the above-mentioned temperature of 300° C., and (ii) the low energy, and insufficient surface migration, of the atoms (e.g., Si atoms) growing into an epitaxial film. In order to eliminate the causes (i) and (ii) of the above problems, the present inventors attempted to raise the substrate temperature during the film growth, through the following Experiment 1.

EXPERIMENT 1

The effects of a rise in the substrate temperature during film growth by the above-described RF-DC coupled mode bias sputtering system on the resultant film were studied.

First, films were grown by the RF-DC coupled mode bias sputtering system at substrate temperatures of 300° to 800° C. Before film growth, the relationship between substrate temperature and background vacuum degree was examined. As a result, it was found that the background vacuum degree is $2.0 \times 10^{-10}$ Torr when the substrate temperature is at the level before heating, i.e., at around room temperature, but the background vacuum degree is decreased to or below $1.0 \times 10^{-8}$ Torr at substrate temperatures exceeding 300° C. and is decreased to or below $1 \times 10^{-7}$ Torr at a substrate temperature of 400° C.

Upon observation of the components of the atmosphere in the film growth chamber under the evacuated background condition, the atmosphere was found to contain mainly $H_2O$, CO and $CO_2$.

For film growth, a 5-inch wafer of n-type (100) FZ silicon with a P concentration of $1.8 \times 10$ cm$^3$ was used as a target, and a 4-inch wafer of p-type (100) FZ silicon with a B concentration of $1.0 \times 10^{15}$ cm$^{-3}$ was used as a substrate.

One side of the silicon substrate was patterned as follows, according to the procedure shown in FIG. 2.

First, as shown in FIG. 2(A), the Si substrate 42 was subjected to thermal oxidation by a resistance heating method, in an atmosphere of a mixture of $H_2$ (2 liters/min) and $O_2$ (4 liters/min) at 1000° C. for 54 minutes, to form an about 2000 A thick $SiO_2$ film 43.

The Si substrate with the $SiO_2$ film 43 thus formed was placed into a spin coater, and a 1 m thick film 44 of a resist (OFPR, a product by Tokyo Ohka Kogyo Co., Ltd.) was formed thereon (FIG. 2(B)).

After being exposed and developed in the usual manner, the Si substrate was transferred into a parallel plates reactive ion etching (RIE) system, in which the $SiO_2$ film was etched away under the etching conditions given below. Thus, patterns were formed on the Si substrate 40. The patterns consisted of a plurality of recessed portions, 1 $\mu$m in which and 1 $\mu$m in height, and a variety of square patterns ranging in size from 10 $\mu$m×10 $\mu$m to 1 mm×1 mm.

| Etching conditions | |
| --- | --- |
| Gas flow rate | $CHF_3:O_2$ = 30 sccm:5 sccm |
| RF power | 700 W |
| Pressure | 0.13 Torr |
| Time | 3 min |

The resist was released from the thus-patterned substrate, to obtain a substrate for experiments (FIG. 2(C)). The substrate was cleaned by the conventional wet process, and placed into the chamber 91 as shown in FIG. 11. The background vacuum degree at a substrate temperature of 300° C. was $9.6 \times 10^{-9}$ Torr. Next, Ar gas was introduced from a gas supply system consisting of an ultraclean gas supply system, to adjust the pressure inside the vacuum chamber at 10 mTorr. The DC voltage on the side of the substrate 16 and the DC voltage on the side of the target 12 were set to predetermined values, given below, and RF power was supplied into the chamber 91 to effect cleaning of the substrate surface.

Subsequently, the substrate temperature was raised to a value in the range from 300° to 800° C. (300°, 400°, 500°, 600°, 700° and 800° C.), and an about 1000 Å thick silicon film was grown at each substrate temperature, with the substrate DC voltage, target DC voltage and RF power adjusted at predetermined values, which are set forth below. The substrate cleaning conditions and film growth conditions used in this experiment are given below. Here, the frequency of the RF power introduced on the target side was maintained at a constant value of 100 MHz.

|  | Cleaning of substrate surface | Growth of Si film |
| --- | --- | --- |
| RF power, target side | 20 w | 200 W |
| DC voltage, target side | −25 V | −250 V |
| Ar gas pressure | 10 mTorr | 10 mTorr |
| DC voltage, substrate side | +10 V | +5 V |
| Substrate temperature | 300° C. | 300–800° C. |
| Process time | 5 min. | 15 min. |

The plasma potential ($V_p$) during film growth was about 35 V, as measured by the usual Langmuir probe method. The potential (Vs) of the substrate was constant at 5 V, because of being controlled by the DC power supply 28 on the substrate side. Driven by the potential difference of about 30 V (=35 V–5 V), the Ar ions in the plasma bombarded the substrate at an energy of about 30 eV. The energy value was suitable for carrying out epitaxial growth without causing damage to the substrate.

During the substrate cleaning, on the other hand, the $V_p$ and $V_s$ were 15 V and 10 V, respectively, and the energy of the Ar ions bombarding the substrate surface was 5 eV. The energy value was suitable for removal of a surface adsorbed molecular layer composed primarily of water molecules.

The thin films thus formed were evaluated through crystal analysis of the thin film on the bare silicon by electron diffraction, resistance measurement by the four-point probe method, measurement of the amounts of impurity atoms Ar, C and O contained in the film by SIMS, measurement of reverse current density of p-n junctions at patterned portions, and evaluation of step coverage by SEM observation.

The results were not good. At substrate temperatures of 300° C. or above, even an epitaxial film comparable in quality to those described in the aforementioned report could not be obtained. Namely, when the substrate temperature was 400° C. or above, even a streak was not observed in the electron diffraction patterns of the resulting films, which indicates the growth of polycrystalline silicon. Also, the resistance measurement and the measurement of reverse current density of p-n junctions gave poor results. These results are probably attributable to the impurities which adhere to the surface of the substrate or of the deposited film, thereby hindering the migration of the film components deposited subsequently. One of the grounds for this reasoning is as follows. The amounts of oxygen and carbon taken into the film, as measured by SIMS, were $5 \times 10^{18}/cm^3$ or above in the cases where the substrate temperature was 400° C. or above.

As is clear from the above description, it was found impossible to solve the aforementioned problems by simply raising the substrate temperature. Incidentally, the experimental results showed that step coverage tends to be improved when the substrate temperature is 400° C. or above.

As a result of the present inventors' further considerations and various investigations, it was found necessary to provide a film growth apparatus with such a construction that the substrate temperature can be raised without causing an increase in the background vacuum degree (which is determined substantially by the amounts, or pressures, of $H_2O$, CO and $CO_2$ present in the vacuum chamber). An apparatus meeting the requirement will be described below.

FIG. 1 shows an example of such an apparatus. The apparatus is a two-frequency type bias sputtering system. In the figure, there are shown a vacuum chamber 11, a target 12, electrostatic chucks 13 and 14, a permanent magnet 15, a substrate 16, a 100-MHz RF power supply 17, a 190-MHz RF power supply 18, matching circuits 19 and 20, a DC power supply 27 for determining the DC potential of the target, a DC power supply 28 for determining the DC potential of the substrate, low-pass filters 21 and 22 for the target and the substrate, respectively, band-pass filters 23 and 24, a magnetic levitation type tandem turbomolecular pump 25, a dry pump 26, and a xenon lamp 29 for heating the substrate.

The vacuum chamber 11 is made of SUS 316 stainless steel, and the inner surface of the chamber is treated by electrolytic compound polishing and electrolytic polishing to a spicular finish, with a surface roughness of $R_{max} < 0.1$ μm, followed by coating with a passive oxide film by use of high purity oxygen. The surfaces of the electrostatic chucks are coated with a highly heat resistant material having good outgassing characteristics, such as boron nitride (BN). This material is merely an example, and any other material that is suitable for minimizing the contamination(with impurities upon a rise in the substrate temperature can be used. The entire part of the gas exhaust system, including mass flow controllers and filters, is formed of SUS 316 stainless steel, which is subjected to electropolishing and passivating treatments or the like so that the gas introduced for the process in the chamber will be substantially free of significant amounts of impurities.

The exhaust, or evacuation, system is constructed as follows. The tandem type turbomolecular pump 25 consists of two magnetic levitation type tandem turbomolecular pumps coupled in series, and the dry pump 26 serves as an auxiliary pump. The exhaust system is an oil-free system so designed as to prevent the contamination of the vacuum chamber 11 with impurities. The secondary turbomolecular pump is of a large flow rate type, and its evacuation rate is maintained even for vacuum degrees on the order of $10^{-3}$ Torr during generation of plasma. The substrate 16 is introduced into the vacuum chamber 11 through a load lock chamber (not shown) disposed in contact with the vacuum chamber 11, whereby a vacuum degree of $10^{-11}$ Torr is achieved in the vacuum chamber 11.

Using the apparatus shown in FIG. 1 and described above, the following experiments were carried out.

EXPERIMENT 2

In consideration of the results obtained in Experiment 1 above, the effects of $H_2O$, CO and $CO_2$ partial pressures during silicon film growth on the characteristics of the resulting film were studied.

The substrate 16 was patterned in the same manner as in Experiment 1. First, as shown in FIG. 2(A), a silicon substrate 42 was thermally oxidized by a resistance heating method in an atmosphere of a mixture of $H_2$ (2 liters/min) and $O_2$ (4 liters/min) at 1000° C. for 54 minutes, to form an about 2000 Å thick $SiO_2$ film 43.

The Si substrate with the $SiO_2$ film 43 thus formed was placed into a spin coater, and a 1 μm thick film 44 of a resist (OFPR, a product by Tokyo Ohka Kogyo Co., Ltd.) was formed thereon (FIG. 2(B)). After being exposed and developed in the usual manner, the Si substrate was transferred into a parallel plates reactive ion etching (RIE) system, in which the $SiO_2$ film 43 was etched away under the etching conditions given below. Thus, patterns were formed on the Si substrate 40. The patterns consisted of a plurality of recessed portions, 1 μm in width and 1 μm in height, and a variety of square patterns ranging in size from 10 μm×10 μm to 1 mm×1 mm.

| Etching conditions | |
|---|---|
| Gas flow rate | $CHF_3:O_2$ = 30 sccm:5 sccm |
| RF power | 700 W |
| Pressure | 0.13 Torr |
| Time | 3 min |

The resist was released from the thus-patterned substrate, to obtain a substrate for experiments (FIG. 2(C)). The substrate was cleaned by the conventional wet process, placed into the chamber 11 and mounted on the electrostatic chuck 14 as shown in FIG. 1. The background vacuum degree at a substrate temperature of 300° C. was $2.0 \times 10^{-10}$ Torr. Next, Ar gas was introduced from a gas supply system consisting of an ultraclean gas supply system, to adjust the pressure inside the vacuum chamber at 10 mTorr. The DC voltage on the side of the substrate 16 and the. DC voltage on the side of the target 12 were set to predetermined values, given below, and RF power was supplied into the chamber 11 to effect cleaning of the substrate surface. Subsequently, the substrate temperature was raised to a value in the range from 300° to 800° C. (300°, 380°, 400°, 420°, 500°, 550°, 600°, 680°, 700°, 720° and 800° C.), and an about 1000 Å thick silicon film was grown at each substrate temperature, with the DC voltages on the substrate 16 and on the target 12 and RF power adjusted at predetermined values, which are set forth below.

The substrate cleaning conditions and film growth conditions used in this experiment are given below. Here, the frequency of the RF power introduced on the target side was maintained at a constant value of 100 MHz.

| | Cleaning of substrate surface | Growth of Si film |
|---|---|---|
| RF power, target side | 20 W | 200 W |
| DC voltage, target side | −25 V | −250 V |
| Ar gas pressure | 10 mTorr | 10 mTorr |
| DC voltage, substrate side | +10 V | +5 V |
| Substrate temperature | 300° C. | 300–800° C. |
| Process time | 5 min. | 15 min. |

The plasma potential ($V_p$) during growth of each silicon film was about 35 V, as measured by the same method as in Experiment 1. The substrate potential ($V_s$) was constant at 5 V because of being controlled by the DC power supply 28 on the substrate side.

Driven by the potential difference of about 30 V (=35 V−5 V), the Ar ions in the plasma bombarded the substrate at an energy of about 30 eV, the value being suitable for carrying out epitaxial growth without causing plasma damage to the substrate.

On the other hand, $V_p$ and $V_s$ during cleaning of the substrate were the same as those in Experiment 1.

The films thus formed were evaluated through crystal analysis of the thin film on the bare substrate by electron diffraction, resistance measurement by the four-point probe method, measurement of the amounts of impurity atoms Ar, C and O contained in the film by SIMS, measurement of reverse current density of p-n junctions at patterned portions, and evaluation of step coverage by SEM observation.

The results of resistivity measurement are graphed in FIG. 3. It is clearly seen from FIG. 3 that the resistivity of the grown silicon films takes its minimum value in the substrate temperature range from 500° to 550° C., and increases abruptly when the substrate temperature exceeds 700° C.

The measurement results of the amount of impurity Ar in the silicon films by SIMS are graphed in FIG. 4. It is apparent from FIG. 4 that the Ar content of the silicon films obtained is small at substrate temperatures in the range from 400° to 700° C., and tends to decrease gradually with an increase in the substrate temperature. It is also seen that the Ar content increases abruptly when the substrate temperature is lowered below 400° C. or exceeds 700° C.

The measurement results of carbon and oxygen contents of the grown silicon films are graphed in FIG. 5. It is clear from FIG. 5 that the C and O contents of the silicon films obtained increase with increasing substrate temperature and, particularly, show an abrupt increase when the substrate temperature exceeds 700° C.

The measurement results of reverse current density of p-n junctions are graphed in FIG. 6. As is apparent from FIG. 6, the reverse current density takes a minimum value in the substrate temperature range from 500° to 550° C., and increases abruptly when the substrate temperature is lowered below 400° C. or raised above 700° C.

The results of electron diffraction, step coverage and background vacuum degree measurements are set forth in Table 1, together with the above results.

The above experimental results revealed the following (i) to (iii):

(i) With respect to resistivity of the grown silicon films and reverse current density of p-n junctions, representing electrical characteristics which are the most important for fabrication of semiconductor devices, good values are obtained when the substrate temperature during film growth was in the range from 400° to 700° C.; better values are obtained at substrate temperature of from 500° to 600° C.; and, particularly, the best values are obtained at substrate temperatures of from 500° to 550° C.

(ii) In view of the above (i) in conjunction with step coverage and the fact that the silicon film can be deposited even on an Al film present on the substrate without causing damage to the Al film, the most preferable range for the substrate temperature during film growth is from 500° to 550° C.

(iii) When the substrate temperature during film growth is below 400° C., Ar ions are heavily adsorbed on the substrate surface, resulting in an increased Ar content of the film obtained. When the substrate temperature exceeds 700° C., the resulting film has a lowered crystallinity and, hence, an increased Ar content.

EXPERIMENT 3

The effects of the energy of each Ar ion during silicon film growth on the resulting film were investigated.

The formation of silicon films in this experiment was carried out in the same manner as in Experiment 2 above, except that the substrate temperature during silicon film growth was fixed at 500° C. and the DC voltage on the side of the substrate 16 was regulated to vary the substrate surface potential in the range from −10 to +20 V. The silicon films thus obtained were subjected to resistance measurement by the four-point probe method and to measurement of impurity Ar content of the resulting silicon films by SIMS, the results being graphed in FIG. 9. It is seen from FIG. 9 that the resistivity of the silicon films decreases with a decrease in the substrate surface potential when the potential is in the range from 0 to 20 V, and the resistivity increases with a decrease in the potential when the potential is lowered below 0 V. Besides, as shown in FIG. 9, variation of the substrate potential in the range from −10 V to +20 V corresponds to variation of the energy of each Ar ion (equivalent to $V_p$−$V_s$) in the range from 15 eV to 45 eV. In other words, the resistivity of the silicon film obtained is increased when the energy of each Ar ion reaches 40 eV.

This experiment revealed the following (i) and (ii):

(i) When the energy of each Ar ion bombarding the substrate exceeds a threshold value (about 40 eV) for sputtering of the silicon substrate by Ar ions, the substrate is damaged and the deposited thin film has a lowered crystallinity and an increased resistivity.

(ii) When the energy of each bombarding Ar ion is insufficient, the crystallinity of the deposited film is again poor.

EXPERIMENT 4

The effects of the partial pressure of $H_2O$, which is the major impurity in a film growth atmosphere, during silicon film growth on the resulting film were studied.

The formation of silicon films in this experiment was carried out in the same manner as in Experiment 2 above, except that the substrate temperature during silicon film growth was fixed at 500° C. and the $H_2O$ partial pressure was varied. For the films thus obtained, Ar content and p-n junction reverse current density were measured in the same manner as in Experiment 2. The results of both measurements are graphed in FIG. 10. As is clearly seen from FIG. 10, both the Ar content of the films and the reverse current density of p-n junctions increase abruptly when the $H_2O$ partial pressure during silicon film growth exceeds $10^{-8}$ Torr.

From this experiment, the following (i) and (ii) were found:

(i) The Ar content of the grown silicon films is controlled to a low level, leading to good crystallinity, when the $H_2O$ partial pressure during film growth is not more than $10^{-8}$ Torr. When the $H_2O$ partial pressure exceeds $10^{-8}$ Torr, on the other hand, the crystallinity is lowered.

(ii) The reverse current density of p-n junctions is controlled to a low level, ensuring good electrical characteristics, when the $H_2O$ partial pressure during film growth is not more than $10^{-8}$ Torr. When the $H_2O$ partial pressure exceeds $10^{-8}$ Torr, on the other hand, the reverse current density is increased and the electrical characteristics worsened.

DETAILED EXPLANATION OF THE PREFERRED EMBODIMENTS

This invention, accomplished based on the findings obtained through the above experiments, provides an improved process for formation of an epitaxial film by a sputtering method.

The process for formation of an epitaxial film by a sputtering method according to this invention typically includes the following two aspects.

In one aspect of this invention, there is provided a process for the formation of an epitaxial film by a sputtering method wherein a DC voltage and a plasma-generating high-frequency power are applied to a target, and said epitaxial film is formed on a substrate to which a DC voltage is being applied by way of a sputtering method, characterized in that film formation is carried out while controlling the partial pressures of $H_2O$, CO and $CO_2$ in an atmosphere of a film growth space respectively at or below $1.0 \times 10^{-8}$ Torr and maintaining the substrate at a temperature in the range of from 400° to 700° C., during the formation of the epitaxial film.

In another aspect of this invention, there is provided a process for the formation of an epitaxial film by a sputtering method wherein a DC voltage and a plasma-generating high-frequency power are applied to a target, and said epitaxial film is formed on a substrate to which a DC voltage is being applied by way of a sputtering method, characterized in that film formation is carried out while controlling the partial pressures of $H_2O$, CO and $CO_2$ in an atmosphere of a film growth space respectively at or below $1.0 \times 10^{-8}$ Torr, maintaining the substrate at a temperature in the range of from 400° to 700° C., and applying a high frequency voltage to the substrate, during the formation of the epitaxial film.

According to this invention, the problems encountered in the prior art as described above are solved and the following effects are provided.

That is, (a) the coefficients of adhesion of atoms which constitute the plasma but are not intended to constitute the deposited film, such as Ar and He, to the substrate surface are markedly reduced; (b) as a result of the above (a), the chance for the non-film-constituent atoms in the plasma (Ar, He, etc.) to be incorporated into the deposited film is greatly reduced; (c) migration of the film constituent atoms at the surface of the substrate or of the growing film is largely increased; and (d) as a result of the above (c), crystal growth is efficiently performed with good step coverage to deposit a high quality crystalline film with good step coverage. According to this invention, therefore, it is possible to obtain high quality epitaxial films efficiently and stably.

Besides, as clearly shown by the above experiments, if one or more of the partial pressures of $H_2O$, CO and $CO_2$ exceed $1 \times 10^{-8}$ Torr or the substrate temperature is below 400° C. or above 700° C. during film growth, it is impossible to obtain a desirable high quality epitaxial film.

In this invention, in order to prevent plasma constituent atoms or the like other than the atoms constituting the deposited film from being incorporated into the film during film growth, it is desirable to use an ultraclean gas supply system for supplying required gases in the process, to use an oil-free ultrahigh vacuum exhaust system and to use a chamber formed of a material which is free of gas release or which barely causes gas release. In addition, for causing stabler plasma, it is effective to apply also a high-frequency power (high-frequency energy) to the substrate. In particular, where the substrate is formed of an insulating material, it is possible to control the electric potential of the substrate surface by regulating the high-frequency power (high-frequency energy) applied to the substrate and the frequency of the power. As for the frequency of the high-frequency energy to be applied to the substrate, it is desired to be higher than the frequency of the high-frequency energy applied to the target.

The DC voltage to be applied to the substrate in this invention includes a voltage of zero volt (0 V).

As for the gas to be supplied upon film formation, it may be an inert gas such as Ar, He, etc., an active gas such as HCl, $F_2$, etc. or a mixture these gases. In any case, it is desired for these gases to be high in purity.

And, as for each of the $H_2O$, CO and $CO_2$ contents, it is desired to be preferably 1 ppm or below, more preferably 100 ppb or below.

The inner pressure of the vacuum chamber upon film formation is maintained at an appropriate value at which discharge is caused as desired in the vacuum chamber. In a preferred embodiment for this, it is in the range of from 1 mTorr to 50 mTorr.

As for the substrate upon film formation, it is desired to be arranged such that a clean surface thereof is exposed. The substrate placed in the vacuum chamber is subjected, for example, to surface cleaning with irradiation of ions while controlling the high-frequency power, the DC voltage, the gas pressure and the like so that no damage is left at the surface of the substrate.

At the time of film formation, it is desired to properly control the energy of each ion to be impinged into the substrate to a magnitude of not causing damage at the surface of the substrate by properly regulating the gas pressure in the vacuum chamber, the high-frequency power supplied to the target, the DC voltage impressed on the target, the DC voltage impressed on the substrate and, if present, the high-frequency power optionally applied to the substrate. In the case where the substrate is such that is comprised of silicon (Si), it is desired for the energy of each ion to be impinged into the substrate to be controlled to 40 eV or below. The value of 40 eV corresponds to the threshold for silicon to be sputtered, and is the upper limit of ion energy which does not cause damage at the surface of the silicon substrate.

Heating of the substrate is carried out desirably by a lamp light irradiation means such as Xe lamp, halogen lamp, etc., a resistance heating means or the like.

In the process of this invention, a single-crystal film of the substance constituting the target is epitaxially grown based on the information of the crystalline orientation of a single-crystal substrate on which it is to be grown. In this case, a dopant in the target is taken into the growing film, maintaining its proportion.

For instance, in the case of forming a silicon epitaxial film using a silicon target containing a dopant in a predetermined proportion, the resulting film has a resistivity equal to about 100–120% of the resistivity of bulk silicon, and exhibits good characteristics. In particular, in the case where the substrate is maintained at a temperature in the range of from 500° to 600° C., the resulting film exhibits extremely good characteristics with a resistivity equal to about 100–110% of that of bulk silicon. As for the resistivity of the film to be formed, it becomes smallest when the film is formed while maintaining the substrate at a temperature in the range of from 500° to 550° C.

Furthermore according to the process of this invention, the substrate is maintained at a temperature of 400° C. or above upon film formation, and because of this, there is provided a marked increase in surface migration of the constituent atoms of an epitaxial film to be formed at the surface of substrate or of the deposited film, whereby the problem of discontinuity in a step portion (defective step coverage) encountered in the prior art is remarkably improved. In particular, in the case where the substrate is maintained at a temperature of 500° C. or above upon film formation, the above problem relating to the discontinuity is sufficiently improved so that it is negligible in fabrication of semiconductor devices. In addition, according to the process of this invention, there is very little possibility for the plasma-generating process gas, e.g. Ar or He, to be incorporated into an epitaxial film to be formed.

On the other hand, in the case where the substrate is maintained at a temperature exceeding 700° C. upon film formation, the resulting film becomes such that is poor in crystallinity, and there is caused a problem that the plasma-generating process gas (Ar, He or the like) is often taken into the film. In general, in the case where the temperature of the substrate upon film formation is raised, there is a tendency that the partial pressures of $H_2O$, CO and $CO_2$ in the film-forming atmosphere increase as the temperature of the substrate rises. In such case, there is a higher possibility for C and O as impurities to be incorporated into a film to be formed, and because of this, the resulting film becomes such that is unsatisfactory in characteristics. This problem does not occur in the process of this invention, because the partial pressures of $H_2O$, CO and $CO_2$ upon film formation are each controlled to $1.0 \times 10^8$ Torr, although the substrate is maintained at a high temperature of from 400° to 700° C. upon film formation.

Additionally, in the case where the substrate is maintained at a temperature exceeding 700° C. upon film formation, the resulting film is poor in characteristics in any case; moreover, it will be impossible to achieve a sharp or shallow dopant profile.

As above stated, the feature of the process for forming an epitaxial film by way of a sputtering method according to this invention lies in that the substrate is maintained at a temperature in a specified temperature range and the partial pressures of $H_2O$, CO and $CO_2$ in the film-forming atmosphere are each maintained at a specified value, during film formation.

The substrate temperature in the process of this invention is in the range of preferably from 400° to 700° C., more preferably from 500° to 600° C., and most preferably from 500° to 550° C.

The partial pressure of each of $H_2O$, CO and $CO_2$ in the film-forming atmosphere is preferably $1.0 \times 16^{-8}$ Torr or below. In a more preferred embodiment, the sum of the partial pressures of $H_2O$, CO and $CO_2$ is made to be $1.0 \times 10^{-8}$ Torr or below.

(EXAMPLES)

This invention will now be explained more in detail with reference to the following examples, which are not to be construed as limiting the invention.

EXAMPLE 1

A bipolar transistor (BPT) was fabricated according to the following procedure (see, FIGS. 7 and 8).
(1) In a p-type silicon substrate 31 having a resistivity of 4 Ωm, an n+ type buried region 32 was formed by the usual diffusion technique.
(2) On the buried region 32 of the Si substrate 31, an n type region 33 with a film thickness of 1.2 μm was formed by the conventional epitaxial film forming process.
(3) An n type region 34 for lowering the collector resistance of the BPT was formed by the usual diffusion technique.
(4) The n⁻ type region 33 was masked by the same method as in Experiment 2, and a groove for forming a device separation region 35 were formed by etching according to the usual RIE process. Arsenic (As) ions were implanted into a bottom portion of the groove in a dose of $2 \times 10^{13}$ cm$^{-2}$ by the conventional ion implantation, thereby forming a channel stop region 36. After removal of the mask, an SiO$_2$ film for forming the device separation region 35 was deposited in a film thickness of 2000 Å by the usual CVD technique to produce the device separation region 35.

(5) Boron atoms (B) as a p-type impurity were implanted into the n$^-$ type region 33, through the SiO$_2$ film for the device separation region, in a dose of $8 \times 10^{13}$ cm$^{-2}$ by the conventional ion implantation to form a base region 37. Then, a contact for depositing an emitter 38 was formed by the usual RIE technique, thereby exposing the base region 37 composed of a p$^+$ type single crystal. Thus, a substrate 16 for the process for forming an epitaxial film according to this invention was obtained. The substrate 16 was cleaned by the usual wet process, and placed in a vacuum chamber 11 of the apparatus shown in FIG. 1. An SiC single-crystal substrate into which As ions had been implanted at an acceleration voltage of 40 keV to attain a dose of $1 \times 10^{15}$ cm$^{-2}$ was used as a target 12. (The substrate 16 was heated to a temperature of 550° C. by irradiating Xe lamp light from a heating means 29.

In the same manner as in Experiment 2, Ar gas was introduced from an ultra-clean gas supply system to control the gas pressure in the chamber 11 to 10 mTorr. In the chamber 11, cleaning of the substrate surface by ion irradiation and formation of an SiC film 38 of 3000 Å in thickness were carried out under the following conditions:

|  | Cleaning of substrate surface | Upon formation of Si film |
|---|---|---|
| RF power, target side | 20 W | 350 W |
| DC voltage, target side | −25 V | −200 V |
| Ar gas pressure | 10 mTorr | 10 mTorr |
| DC voltage, substrate side | +10 V | +8 V |
| Substrate temperature | 550° C. | 550° C. |
| Process time | 5 min. | 60 min. |

The plasma potential ($V_p$) during the formation of the SiC film was about 45 V, as measured by the same method as in Experiment 1. The substrate potential ($V_s$) was controlled to 8 V by regulating a DC power supply. Driven by the potential difference of about 37 V (=45 V−8 V), the Ar ions in the plasma were incident on the substrate at an energy of about 37 eV. The energy value was at a suitable level for effecting epitaxial growth without causing damage to the substrate.

The SiC film thus obtained was patterned in the same manner as in Experiment 2 described above, thereby forming an SiC emitter 38.

(6) An insulating film 39 of SiO$_2$ with 0.5 μm thickness was deposited by the conventional CVD at normal pressure, and contact holes for forming wiring electrodes were produced therein in the same manner as in Experiment 2. An aluminum film was then deposited and patterned to obtain the wiring electrodes 40.

(7) An insulating film 41 of SiO$_2$ was deposited, and external take-off ports were fabricated by the usual semiconductor processing.

In the structural process according to this example as described above, the most important factor is the operation of forming the emitter, on which the characteristics of the BPT obtained depend. According to this example, by using SiC, which is a material having a wider band gap as compared with Si, as a material for the emitter, a hetero bipolar transistor (HBT) with a greater $h_{FE}$ was obtained successfully through blocking of holes injected from the base region into the emitter region. It is further possible to obtain a clean surface free of spontaneous formation of oxide films due to incorporation of impurities which, if present, would lower the emitter-base interface characteristics. Since the emitter region is composed of an epitaxially grown single crystal, moreover, the emitter resistance is low. Thus, a high-speed high-performance HBT was obtained.

This invention has made possible the formation of a BPT with such a small film thickness as not to be obtainable by the ion implantation technique conventionally used in semiconductor processing. That is, according to this invention, it has become possible to form an emitter 38, with 3000 Å film thickness, of an epitaxially grown SiC film and to provide a high performance BPT.

Although this example has been described with reference to provision of the aluminum wiring electrodes 40 directly on the SiC film 38 serving as the emitter material, a further reduction in the contact resistance between the SiC film 38 and the aluminum wiring electrode. 40 was possible when a poly-silicon film was provided between the SiC film 38 and the aluminum wiring electrode 40.

The bias sputtering process according to this invention promises easy control of film thickness, in the film thickness range from about 50 Å. When the sputtering process of this invention was applied to the formation of the base region as well as to the formation of the emitter region, therefore, it was possible to sufficiently meet the recent requirements for a shallower base region. Furthermore, the formation of a film at a comparatively low temperature enables the dopant profile in the film to have a very sharp pattern, which is profitable for fabricating high-performance devices.

EXAMPLE 2

In this example, the same apparatus (see, FIG. 1) and the procedures of the foregoing Experiment 2 were used, to form a silicon (100) single crystal film on the (1012) surface of a sapphire (Al$_2$O$_3$) substrate 16 by heteroepitaxial growth. Since the substrate 16 is an insulator, the substrate irradiation energy of Ar ions determined by the difference between the plasma potential and the substrate potential is not determined only by the DC voltage impressed on the substrate side but is determined also by the high-frequency energy supplied to the substrate 16 from the high-frequency power supply 18.

Using an n-type FZ silicon (111), doped with $1.8 \times 10^{18}$ cm$^{-2}$ of phosphorus, as the material for the target 12, the Si (100) single crystal film was epitaxially grown to a film thickness of 1000 Å. The conditions for cleaning the substrate surface and the conditions for forming the Si film are given below.

|  | Cleaning of substrate surface | Upon formation of Si film |
|---|---|---|
| RF power, target side | 20 W | 200 W |
| DC voltage, target side | −25 V | −250 V |
| Ar gas pressure | 10 mTorr | 10 mTorr |
| RF frequency, substrate side | 190 MHz | 190 MHz |
| RF power, substrate side | 10 W | 15 W |
| RF frequency, target side | 100 MHz | 100 MHz |
| Substrate temperature | 500° C. | 500° C. |
| Treatment time | 5 min | 15 min |

The plasma potential ($V_p$) during the growth of the Si film was about 35 V, as measured in the same manner as in Experiment 1. The substrate potential ($V_s$) was controlled to −2 V, by the high-frequency power supply 18 on the substrate side and a matching circuit 20. Driven by the potential difference of about 37 V (=35 V−(−2 V)), the Ar ions in the plasma were incident on the substrate at an energy of about 37 eV. The energy value was suitable for effecting epitaxial growth without causing damage to the substrate.

On the other hand, the values of $V_p$ and $V_s$ during substrate cleaning were 15 V and 10 V, respectively, and the energy of the Ar ions impinging to the substrate surface was 5 eV.

The thin film thus obtained was subjected to observation of etch pit density by the Wright etching technique, which is an etching for visualizing crystal defects, and analysis of the density of crystalline imperfections such as stacking faults and dislocations by TEM observation of a section of the film. As a result, both the etch pit density and the imperfection density were found to be in the range from $1.0 \times 10^7/cm^{-2}$ to $1.0 \times 10^8/cm^{-2}$, indicating good crystallinity. For examining the degree of incorporation of aluminum atoms into the Si film through diffusion, the thin film was subjected to SIMS measurements, which gave no detection of aluminum. That is, the concentration of aluminum atoms in the Si film was below the limit of detection of $2 \times 10^{15}$ $cm^{-2}$.

Furthermore, the mobility of electrons and holes were measured by Van der Pauw method. The mobility was found to be 240 $cm^2/V \cdot sec$, the value being approximate to that for bulk Si at a normal temperature of 300 K.

As is apparent from the above results, an SOS (silicon on sapphire) film having excellent crystallinity and carrier mobility was obtained. In addition, the problem of elastic compressive strains induced in the Si film by the difference between the coefficient of thermal expansion of sapphire ($9.5 \times 10^{-6}/°$ C.) and that of silicon ($4.2 \times 10^{-6}/°$ C.), usually the case with the conventional CVD techniques, has been markedly improved by this invention. More precisely, the invention has made it possible to reduce the elastic compressive strain to $10^8$ $dyn/cm^2$ or below, due to the film growth at a comparatively low temperature (in this example, 500° C.).

EXAMPLE 3

A silicon film of 1000 Å in thickness was formed in the same manner as in the foregoing Experiment 2 except that a p-type FZ silicon (111) wafer (4° offset in (211) direction), doped with $1.0 \times 10^{15}$ $cm^{-3}$ of boron atoms, was used as a substrate. The conditions for cleaning the substrate surface and the conditions for forming the Si film are given below.

|  | Cleaning of substrate surface | Growth of Si film |
|---|---|---|
| RF power, target side | 20 W | 200 W |
| DC voltage, target side | −25 V | −250V |
| Ar gas pressure | 10 mTorr | 10 mTorr |
| DC voltage, substrate side | +10 V | +2 V |
| Substrate temperature | 300° C. | 500° C. |
| Process time | 5 min. | 25 min. |

The plasma potential ($V_p$) during the Si film growth was about 37 V, as measured by the same method as in Experiment 1, whereas the substrate potential ($V_s$) was 2 V. Driven by the potential difference, the Ar ions in the plasma bombarded the substrate surface at an energy of about 35 V (=37 V−2 V). The energy value was at a suitable level for carrying out epitaxial growth without damage to the substrate.

During the substrate cleaning, on the other hand, the values of $V_p$ and $V_s$ were 15 V and 10 V, respectively, and the energy of Ar ions impinging on the substrate surface was 5 eV.

The Si thin film thus obtained showed very good physical properties and step coverage, substantially equivalent to those obtained at a substrate temperature of 500° C. in the foregoing Experiment 2

TABLE 1

| substrate temperature | 300° C. | | 380° C. | | 400° C. | | 420° C. | | 500° C. | | 550° C. | |
|---|---|---|---|---|---|---|---|---|---|---|---|---|
| resistance (Ω· cm) | $1.9 \times 10^{-2}$ | Δ | $1.6 \times 10^{-2}$ | Δ | $1.5 \times 10^{-2}$ | ⊚ | $1.5 \times 10^{-2}$ | ○ | $1.4 \times 10^{-2}$ | ⊚ | $1.4 \times 10^{-2}$ | ⊚ |
| Ar content ($cm^{-3}$) | $8.0 \times 10^{10}$ | X | $3.2 \times 10^{18}$ | X | $1.3 \times 10^{10}$ | ○ | $1.2 \times 10^{10}$ | ○ | $1.0 \times 10^{10}$ | ○ | $8.8 \times 10^{17}$ | ⊚ |
| O content ($cm^{-3}$) | $1.2 \times 10^{18}$ | | $1.4 \times 10^{10}$ | ⊚ | $1.5 \times 10^{10}$ | ⊚ | $1.6 \times 10^{10}$ | ⊚ | $2.5 \times 10^{10}$ | ⊚ | $3.0 \times 10^{18}$ | ○ |
| C content ($cm^{-3}$) | $6.0 \times 10^{17}$ | | $8.1 \times 10^{17}$ | ⊚ | $8.8 \times 10^{17}$ | ⊚ | $9.1 \times 10^{10}$ | ⊚ | $1.5 \times 10^{18}$ | ⊚ | $2.1 \times 10^{16}$ | ○ |
| p-n junction reverse current (A/cm) | $1.9 \times 10^{-9}$ | Δ | $7.2 \times 10^{-10}$ | Δ | $6.0 \times 10^{-10}$ | ○ | $5.5 \times 10^{-10}$ | ○ | $4.0 \times 10^{-10}$ | ⊚ | $4.0 \times 10^{-10}$ | ⊚ |
| electron diffraction | Kikuchi line | | Kikuchi line | ⊚ | Kikuchi line | ⊚ | Kikuchi line | ⊚ | Kikuchi line | ⊚ | Kikuchi line | ⊚ |
| step coverage | X | | Δ | | ○ | | ○ | | ⊚ | | ⊚ | |
| background (Torr) vacuum degree | $2.0 \times 10^{-10}$ | | $3.6 \times 10^{-10}$ | | $4.0 \times 10^{-10}$ | | $4.2 \times 10^{-10}$ | | $8.0 \times 10^{-10}$ | | $3.0 \times 10^{-9}$ | |

| substrate temperature | 600° C. | | 680° C. | | 700° C. | | 720° C. | | 800° C. | |
|---|---|---|---|---|---|---|---|---|---|---|
| resistance (Ω· cm) | $1.5 \times 10^{-2}$ | ⊚ | $1.6 \times 10^{-2}$ | ⊚ | $1.6 \times 10^{-2}$ | ⊚ | $2.8 \times 10^{-2}$ | Δ | $9.0 \times 10^{-2}$ | X |
| Ar content ($cm^{-3}$) | $8.0 \times 10^{17}$ | ⊚ | $6.3 \times 10^{17}$ | ⊚ | $6.0 \times 10^{17}$ | ⊚ | $9.1 \times 10^{17}$ | ○ | $8.0 \times 10^{10}$* | X* |
| O content ($cm^{-3}$) | $3.8 \times 10^{10}$ | ○ | $7.1 \times 10^{10}$ | Δ | $8.0 \times 10^{10}$ | Δ | $1.6 \times 10^{19}$ | X | $1.3 \times 10^{20}$ | X |
| C content ($cm^{-3}$) | $3.1 \times 10^{18}$ | ○ | $5.6 \times 10^{10}$ | Δ | $6.0 \times 10^{10}$ | Δ | $1.3 \times 10^{19}$ | X | $1.4 \times 10^{20}$ | X |
| p-n junction reverse current (A/cm) | $4.5 \times 10^{-10}$ | ⊚ | $6.1 \times 10^{10}$ | ○ | $7.0 \times 10^{-10}$ | ⊚ | $2.1 \times 10^{-9}$ | Δ | $1.4 \times 10^{-8}$ | X |
| electron diffraction | Kikuchi line | ⊚ | Kikuchi line | ⊚ | Kikuchi line | ⊚ | streak and weak kikuchi line | Δ | streak | Δ |
| step coverage | ⊚ | | ⊚ | | ⊚ | | ⊚ | | ⊚ | |
| background (Torr) vacuum degree | $7.0 \times 10^{-9}$ | | $9.1 \times 10^{-9}$ | | $1.0 \times 10^{-8}$ | | $1.3 \times 10^{-8}$ | | $8.0 \times 10^{-8}$ | | note):
⊚ excellent
○ good
Δ acceptable
X not acceptable
*the amount increased because of slight inferiority in crystallinity

Figure 1:
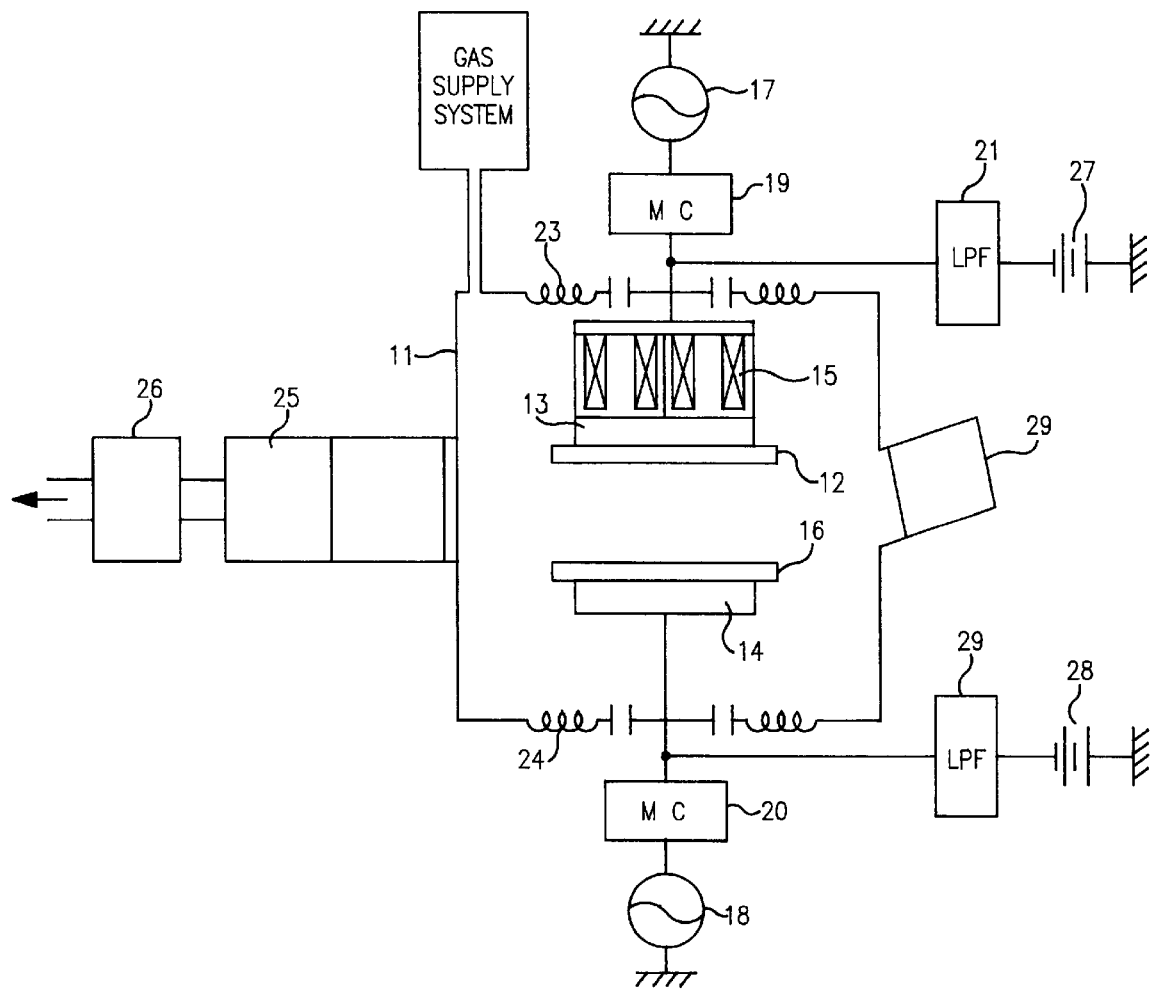
FIG. 1 is a schematic explanatory view illustrating an embodiment of the apparatus suitable for practicing the present invention.
Figure 2A:
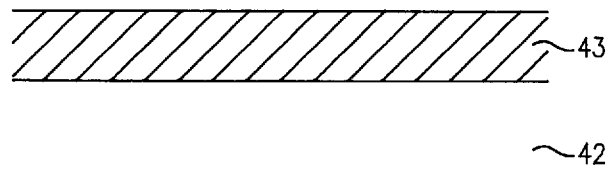
FIG. 2 is a schematic explanatory view illustrating the steps for pattern formation.
Figure 2B:
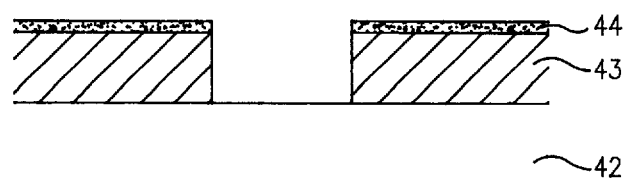
Figure 2C:
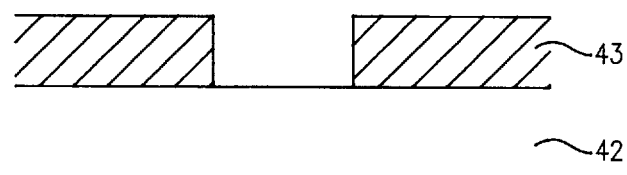
Figure 3:
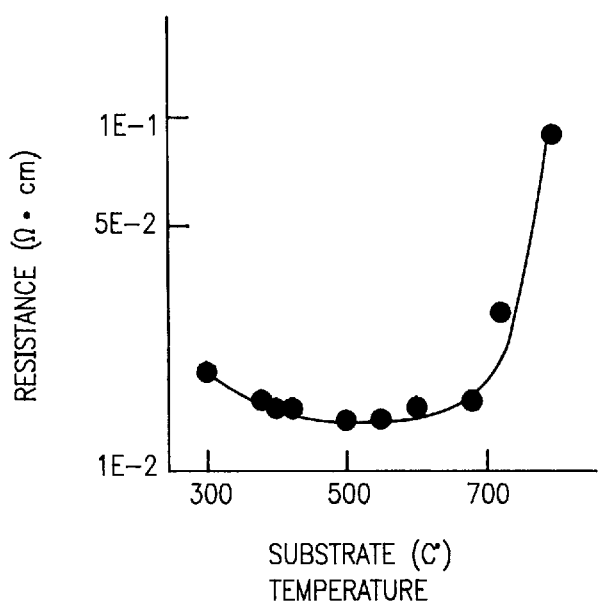
FIG. 3 is a diagram showing the relationship between the temperature of a substrate upon formation of an epitaxial film and the resistivity of the film obtained.
Figure 4:
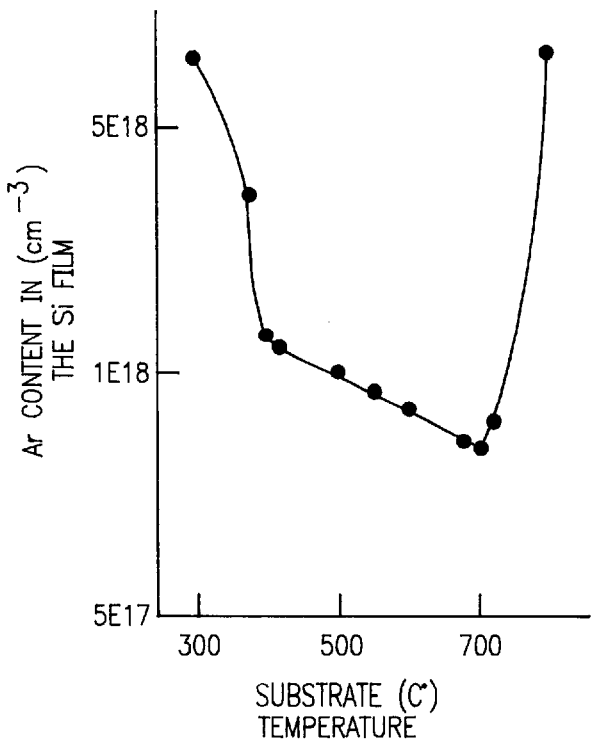
FIG. 4 is a diagram showing the relationship between the temperature of a substrate upon formation of an epitaxial film and the Ar content in the film obtained.
Figure 5:
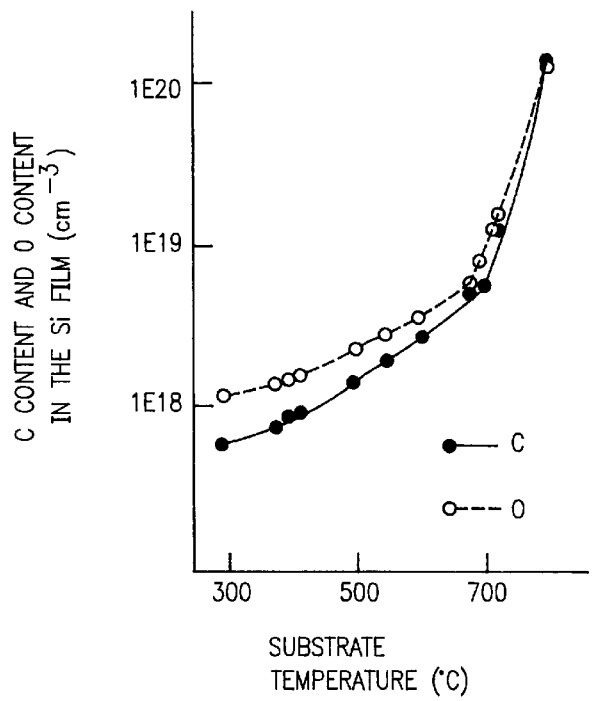
FIG. 5 is a diagram showing the relationship between the temperature of a substrate upon formation of an epitaxial film and the C and O contents in the film obtained.
Figure 6:
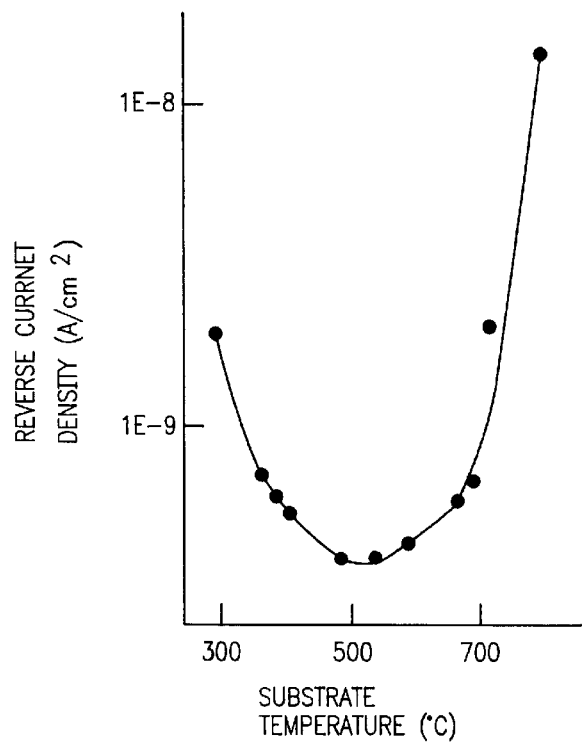
FIG. 6 is a diagram showing the relationship between the temperature of a substrate upon formation of an epitaxial film and the reverse current density of a p-n junction formed by the epitaxial film.
Figure 7:
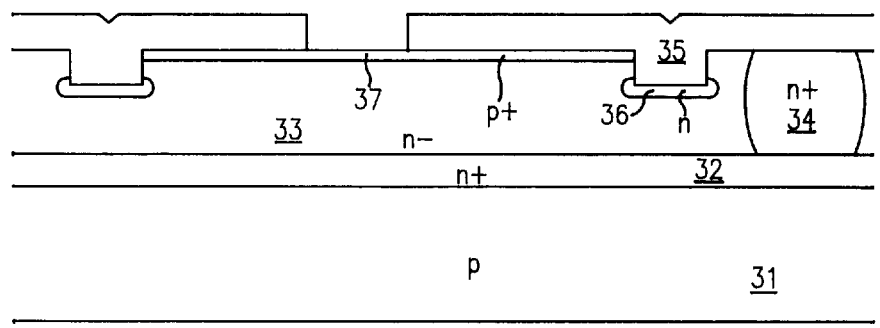
FIG. 7 is a schematic view illustrating a first half of the process of fabricating a bipolar transistor.
Figure 8:
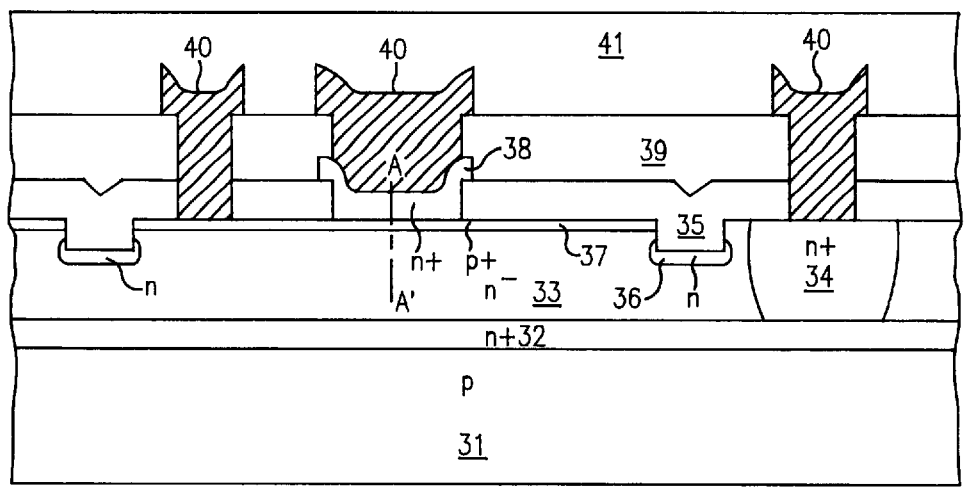
FIG. 8 is a schematic view illustrating a second half of the process of fabricating the bipolar transistor.
Figure 9:
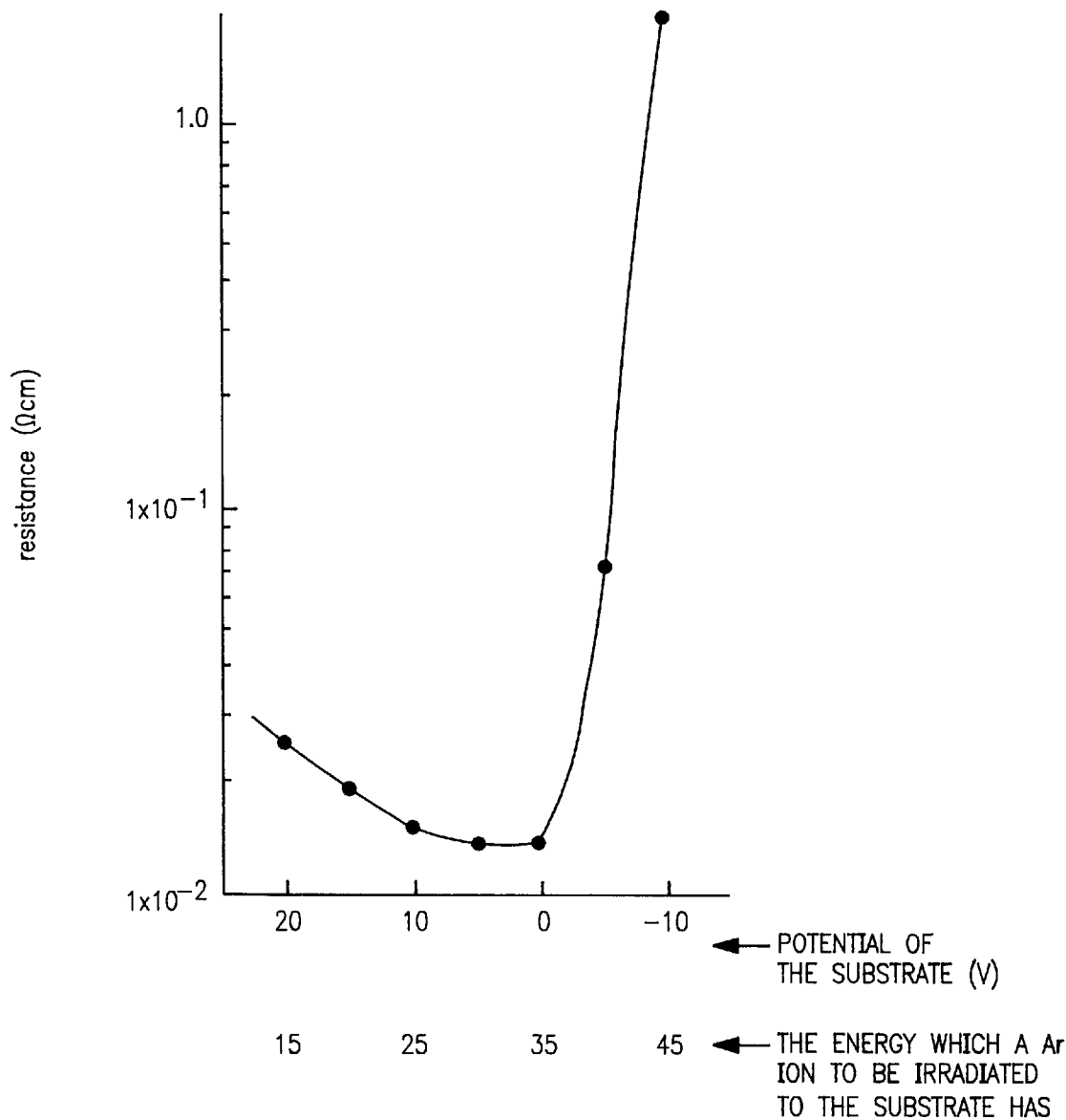
FIG. 9 is a diagram showing the relationship between the potential of a substrate upon formation of an epitaxial film and the resistivity of the film obtained.
Figure 10:
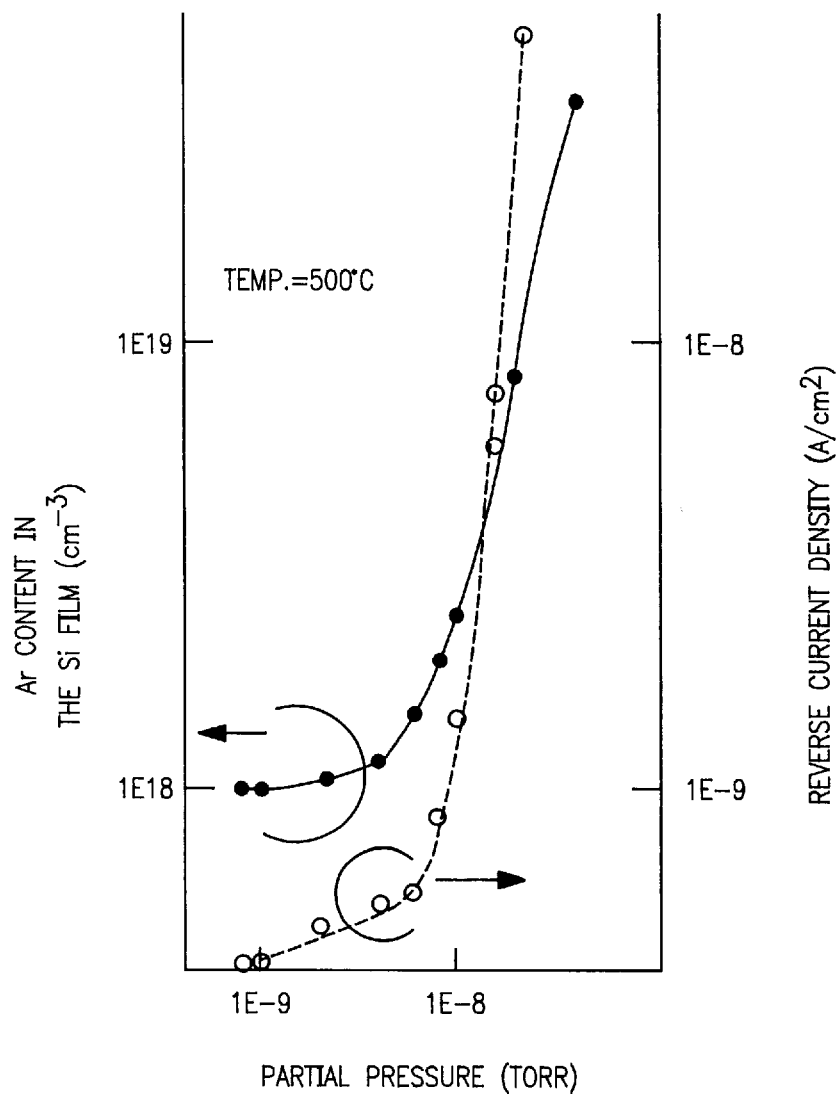
FIG. 10 is a diagram showing the relationship between $H_2O$ partial pressure upon formation of an epitaxial film and the Ar content in the film obtained, and the relationship between $H_2O$ partial pressure upon formation of an epitaxial film and the reverse current density.
Figure 11:
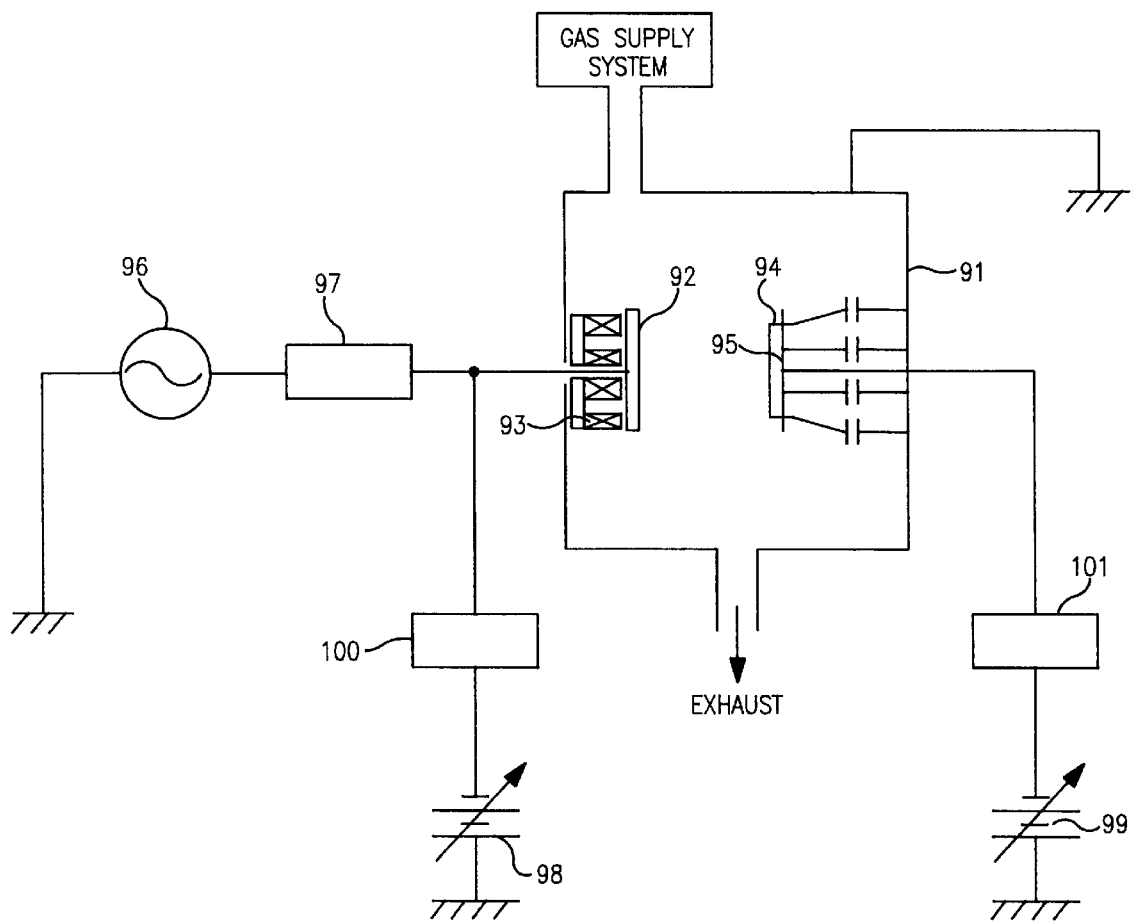
FIG. 11 is a schematic explanatory view illustrating the constitution of a known sputtering apparatus.

We claim:

1. A process for forming a silicon-containing epitaxial film on a substrate arranged in a film-forming space by a sputtering method comprising the steps of:
   (a) introducing into said film-forming space containing said substrate therein a plasma-generating raw process gas containing 1 ppm or less of each of $H_2O$, CO and $CO_2$;
   (b) controlling the partial pressure of each of said $H_2O$, CO and $CO_2$ to a value of $1.0 \times 10^{-8}$ Torr or less and the sum of the partial pressures of said $H_2O$, CO and $CO_2$ to a value of $1.0 \times 10^{-8}$ Torr or less in the gaseous atmosphere in said film-forming space;
   (c) maintaining said substrate at a temperature in the range of 400° to 700° C.;
   (d) applying a DC voltage to a silicon-containing target arranged in said film-forming space while simultaneously applying a plasma-generating high frequency power to said silicon containing target, to produce plasma in said film forming space, wherein said silicon-containing target is sputtered by said plasma to cause the formation of said silicon-containing epitaxial film on said substrate.

2. The process for forming an epitaxial film according to claim 1, wherein a high-frequency power is applied also to the substrate.

3. The process for forming an epitaxial film according to claim 2, wherein the high-frequency power to be applied to the substrate has a frequency higher than that of the high-frequency power to be applied to the target.

4. A process for forming a silicon-containing epitaxial film on a substrate arranged in a film-forming space by a sputtering method said process comprising the steps of:
   (a) introducing into said film-forming space containing said substrate therein a plasma-generating process gas containing 1 ppm or less of each of $H_2O$, CO and $CO_2$;
   (b) controlling the partial pressure of each of said $H_2O$, CO and $CO_2$ to a value of $1.0 \times 10^{-8}$ Torr or less and the sum of the partial pressures of said $H_2O$, CO and $CO_2$ to a value of $1.0 \times 10^{-8}$ Torr or less in the gaseous atmosphere in said film-forming space;
   (c) maintaining said substrate at a temperature in the range of 400° to 700° C.;
   (d) applying a DC voltage to a silicon-containing target arranged in said film-forming space while simultaneously applying a plasma-generating high frequency power to said silicon-containing target and a high frequency power of a frequency higher than that of said plasma-generating high frequency power to said substrate, to produce plasma in said film-forming space, wherein said silicon-containing target is sputtered by said plasma to cause the formation of said silicon-containing epitaxial film on said substrate.

5. A process for forming a silicon-containing epitaxial film on a substrate arranged in a film-forming space by a sputtering method, said process comprising the steps of:
   (a) introducing a plasma-generating raw process gas whose content of each of $H_2O$, CO, and $CO_2$ being 1 ppm or less into said film-forming space containing said substrate therein;
   (b) controlling the gaseous atmosphere in said film-forming space to have a vacuum, wherein a partial pressure of each of said $H_2O$, CO, and $CO_2$ is $1.0 \times 10^{-8}$ or less, and the sum of the partial pressures of said $H_2O$, CO, and $CO_2$ is $1.0 \times 10^{-8}$ or less;
   (c) maintaining said substrate at a temperature in the range of 400° to 700° C.; and
   (d) applying a DC voltage to a silicon-containing target arranged in said film-forming space while simultaneously applying a plasma-generating high frequency power to said silicon-containing target to produce plasma in said film-forming space, wherein said silicon-containing target is sputtered by said plasma to cause the formation of said silicon-containing epitaxial film on said substrate.

6. The process according to claim 5, wherein a high frequency power is also applied to the substrate.

7. The process according to claim 6, wherein the high frequency power applied to the substrate has a frequency which is greater than that of the high frequency power applied to the silicon-containing target.

* * * * *

UNITED STATES PATENT AND TRADEMARK OFFICE
CERTIFICATE OF CORRECTION

PATENT NO. : 5,849,163

DATED : December 15, 1998

INVENTOR(S) : TAKESHI ICHIKAWA ET AL.

It is certified that error appears in the above-identified patent and that said Letters Patent is hereby corrected as shown below:

Title page, items,
[63] RELATED U.S. APPLICATION DATA

"which is a continuation of PCT/JP90/01633, Dec. 14, 1990", abandoned should be deleted.
After "752,608", insert --August 15, 1991, abandoned--.

[30] FOREIGN APPLICATION PRIORITY DATA

Insert: --PCT/JP90/01633, December 14, 1990--.

[56] REFERENCES CITED

Other Publications
After "Tadatsugu Itoh et al.", "(1977." should read --(1977).--.

COLUMN 2

Line 11, "h as" should read --has--.

UNITED STATES PATENT AND TRADEMARK OFFICE
CERTIFICATE OF CORRECTION

PATENT NO.  : 5,849,163

DATED       : December 15, 1998

INVENTOR(S) : TAKESHI ICHIKAWA ET AL.

It is certified that error appears in the above-identified patent and that said Letters Patent is hereby corrected as shown below:

COLUMN 3

Line 30, "(which" should read --which--.

COLUMN 6

Line 29, "contamination(with" should read
   --contamination with--.

COLUMN 9

Line 6, "resulting silicon" should read --silicon--.
Line 8, "silicon" should read --resulting silicon--.

COLUMN 10

Line 8, "is." should read --is--.
Line 16, "of." should read --of--.
Line 53, "an." should read --an--.

UNITED STATES PATENT AND TRADEMARK OFFICE
CERTIFICATE OF CORRECTION

PATENT NO. : 5,849,163

DATED : December 15, 1998

INVENTOR(S) : TAKESHI ICHIKAWA ET AL.

It is certified that error appears in the above-identified patent and that said Letters Patent is hereby corrected as shown below:

COLUMN 11

Line 5, "these" should read --of these--.

COLUMN 12

Line 24, "1.0x10$^8$Torr," should read --1.0x10$^{-8}$Torr,--.

COLUMN 14

Line 22, "electrode." should read --electrode--.

COLUMN 16

Table 1, "○ 8.0 x 10$^{10*}$ X*" should read
    --○*8.0 x 10$^{10}$ X*--.

COLUMN 17

Line 65, "700°C;" should read --700°C; and --.

UNITED STATES PATENT AND TRADEMARK OFFICE
CERTIFICATE OF CORRECTION

PATENT NO. : 5,849,163

DATED : December 15, 1998

INVENTOR(S) : TAKESHI ICHIKAWA ET AL.

It is certified that error appears in the above-identified patent and that said Letters Patent is hereby corrected as shown below:

<u>COLUMN 18</u>

Line 38, "700°C;" should read --700°C; and --.

Signed and Sealed this

Twenty-first Day of September, 1999

*Attest:*

*Attesting Officer*

Q. TODD DICKINSON

*Acting Commissioner of Patents and Trademarks*